US008941994B2

(12) United States Patent
Campbell et al.

(10) Patent No.: US 8,941,994 B2
(45) Date of Patent: Jan. 27, 2015

(54) VAPOR CONDENSER WITH THREE-DIMENSIONAL FOLDED STRUCTURE

(75) Inventors: Levi A. Campbell, Poughkeepsie, NY (US); Richard C. Chu, Hopewell Junction, NY (US); Milnes P. David, Fishkill, NY (US); Michael J. Ellsworth, Jr., Lagrangeville, NY (US); Madhusudan K. Iyengar, Foster City, CA (US); Roger R. Schmidt, Poughkeepsie, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 308 days.

(21) Appl. No.: 13/613,753

(22) Filed: Sep. 13, 2012

(65) Prior Publication Data
US 2014/0071626 A1    Mar. 13, 2014

(51) Int. Cl.
*H05K 7/20* (2006.01)
*F28F 3/00* (2006.01)

(52) U.S. Cl.
CPC .................................. *H05K 7/20309* (2013.01)
USPC ........................... 361/701; 165/80.4; 165/166

(58) Field of Classification Search
CPC ....... H01L 23/427; F28D 5/00; F28D 9/0081; F28D 7/163; F28D 5/0233; F28D 5/2021; F28D 5/0028
See application file for complete search history.

(56) References Cited

U.S. PATENT DOCUMENTS

| 753,555 | A | 5/1904 | Douglas |
| 2,171,790 | A | 9/1939 | Higham et al. |
| 2,784,947 | A | 3/1957 | Peterson |
| 2,804,285 | A | 8/1957 | Peterson |

(Continued)

FOREIGN PATENT DOCUMENTS

| DE | 103 34 798 A1 | 3/2005 |
| DE | 10 2012 218 873 A1 | 5/2013 |

OTHER PUBLICATIONS

International Search Report (ISR) and Written Opinion for DE 10-2013-217615.5, dated Oct. 18, 2013 (4 pages) (German Document).

(Continued)

*Primary Examiner* — Gregory Thompson
(74) *Attorney, Agent, or Firm* — Steven Chiu, Esq.; Kevin P. Radigan, Esq.; Heslin Rothenberg Farley & Mesiti P.C.

(57) ABSTRACT

A vapor condenser is provided which includes a three-dimensional folded structure which defines, at least in part, a set of coolant-carrying channels and a set of vapor condensing channels, with the coolant-carrying channels being interleaved with and extending parallel to the vapor condensing channels. The folded structure includes a thermally conductive sheet with multiple folds in the sheet. One side of the sheet is a vapor condensing surface, and the opposite side of the sheet is a coolant-cooled surface, with at least a portion of the coolant-cooled surface defining the coolant-carrying channels, and being in contact with coolant within the coolant-carrying channels. The vapor condenser further includes, in one embodiment, a top plate, and first and second end manifolds which are coupled to opposite ends of the folded structure and in fluid communication with the coolant-carrying channels to facilitate flow of coolant through the coolant-carrying channels.

20 Claims, 11 Drawing Sheets

(56) References Cited

U.S. PATENT DOCUMENTS

| | | | |
|---|---|---|---|
| 3,417,814 A | 12/1968 | Oktay | |
| 4,493,010 A | 1/1985 | Morrison et al. | |
| 4,942,654 A | 7/1990 | Wright et al. | |
| 5,285,347 A | 2/1994 | Fox et al. | |
| 5,390,077 A | 2/1995 | Paterson | |
| 5,490,559 A * | 2/1996 | Dinulescu | 165/148 |
| 5,529,115 A | 6/1996 | Paterson | |
| 6,237,222 B1 | 5/2001 | Chen | |
| 6,237,223 B1 | 5/2001 | McCullough | |
| 6,490,160 B2 | 12/2002 | Dibene et al. | |
| 6,533,029 B1 | 3/2003 | Phillips | |
| 6,580,609 B2 | 6/2003 | Pautsch | |
| 6,609,561 B2 | 8/2003 | Sauciuc et al. | |
| 6,651,734 B1 | 11/2003 | Liu | |
| 6,808,015 B2 | 10/2004 | Osakabe | |
| 7,320,178 B2 | 1/2008 | Kirby et al. | |
| 7,369,410 B2 | 5/2008 | Chen et al. | |
| 7,385,810 B2 | 6/2008 | Chu et al. | |
| 7,540,318 B2 | 6/2009 | Nitta et al. | |
| 7,545,644 B2 | 6/2009 | Fedorov | |
| 7,556,089 B2 | 7/2009 | Bhatti et al. | |
| 7,661,463 B2 | 2/2010 | Liu | |
| 7,796,389 B2 | 9/2010 | Edmunds et al. | |
| 8,014,150 B2 | 9/2011 | Campbell et al. | |
| 8,018,720 B2 | 9/2011 | Campbell et al. | |
| 8,059,400 B2 | 11/2011 | Lu et al. | |
| 8,059,405 B2 | 11/2011 | Campbell et al. | |
| 8,134,833 B2 | 3/2012 | Agostini et al. | |
| 8,179,677 B2 | 5/2012 | Campbell et al. | |
| 8,184,436 B2 | 5/2012 | Campbell et al. | |
| 8,261,445 B2 | 9/2012 | Kadah | |
| 8,345,423 B2 * | 1/2013 | Campbell et al. | 361/699 |
| 8,468,697 B2 | 6/2013 | Tochon et al. | |
| 8,520,388 B2 | 8/2013 | Kurosawa | |
| 8,619,425 B2 | 12/2013 | Campbell et al. | |
| 8,739,406 B2 * | 6/2014 | Campbell et al. | 29/890.07 |
| 2002/0149912 A1 | 10/2002 | Chu | |
| 2004/0069005 A1 | 4/2004 | Kyees | |
| 2006/0162898 A1 | 7/2006 | Reyzin et al. | |
| 2006/0162903 A1 * | 7/2006 | Bhatti et al. | 165/104.14 |
| 2008/0128109 A1 | 6/2008 | Gwin et al. | |
| 2008/0232064 A1 | 9/2008 | Sato et al. | |
| 2009/0086432 A1 | 4/2009 | Campbell et al. | |
| 2010/0263855 A1 | 10/2010 | Arimilli et al. | |
| 2011/0192574 A1 | 8/2011 | Yoshikawa et al. | |
| 2011/0205705 A1 | 8/2011 | Graybill et al. | |
| 2011/0315343 A1 | 12/2011 | Campbell et al. | |
| 2011/0315344 A1 | 12/2011 | Campbell et al. | |
| 2011/0315353 A1 | 12/2011 | Campbell et al. | |
| 2013/0105122 A1 | 5/2013 | Campbell et al. | |

OTHER PUBLICATIONS

Campbell et al., "Vapor Condenser With Three-Dimensional Folded Structure", U.S. Appl. No. 13/788,722, filed Mar. 7, 2013 (40 pages).

Campbell et al., Notice of Allowance for U.S. Appl. No. 13/788,722, filed Mar. 7, 2013, dated Jan. 22, 2014 (12 pages).

Campbell et al., "Two-Phase, Water-Based Immersion-Cooling Apparatus with Passive Deionization", U.S. Appl. No. 13/187,556, filed Jul. 21, 2011.

Campbell et al., "Wicking Vapor-Condenser Facilitating Immersion-Cooling of Electronic Component(s)", U.S. Appl. No. 13/281,669, filed Oct. 26, 2011.

Campbell et al., "Multi-Fluid, Two-Phase Immersion-Cooling of Electronic Component(s)", U.S. Appl. No. 13/281,945, filed Oct. 26, 2011.

* cited by examiner

VAPOR CONDENSER WITH THREE-DIMENSIONAL FOLDED STRUCTURE

BACKGROUND

As is known, operating electronic components produce heat. This heat should be removed in order to maintain device junction temperatures within desirable limits, with failure to remove heat effectively resulting in increased component temperatures, potentially leading to thermal runaway conditions. Several trends in the electronics industry have combined to increase the importance of thermal management, including heat removal for electronic components, including technologies where thermal management has traditionally been less of a concern, such as CMOS. In particular, the need for faster and more densely packed circuits has had a direct impact on the importance of thermal management. First, power dissipation, and therefore heat production, increases as device operating frequencies increase. Second, increased operating frequencies may be possible at lower device junction temperatures. Further, as more and more devices or components are packed onto a single chip, heat flux (Watts/cm$^2$) increases, resulting in the need to remove more power from a given size chip or module. These trends have combined to create applications where it is no longer desirable to remove heat from modern devices solely by traditional air cooling methods, such as by using air cooled heat sinks with heat pipes or vapor chambers. Such air cooling techniques are inherently limited in their ability to extract heat from an electronic component with high power density.

The need to cool current and future high heat load, high heat flux electronic devices therefore mandates the development of aggressive thermal management techniques, using liquid cooling. Various types of liquid coolants provide different cooling capabilities. For example, fluids such as refrigerants or other dielectric liquids (e.g., fluorocarbon liquid) exhibit lower thermal conductivity and specific heat properties compared to liquids such as water or other aqueous fluids. Dielectric liquids have an advantage, however, in that they may be placed in direct physical contact with electronic devices or components and their interconnects without adverse affects, such as corrosion or electrical short circuits. Other cooling liquids, such as water or other aqueous fluids, exhibit superior thermal conductivity and specific heat compared with dielectric fluids. Water-based coolants, however, must be kept from physical contact with electronic devices and interconnects, since corrosion and electrical short circuit problems are otherwise likely to result.

BRIEF SUMMARY

The shortcomings of the prior art are overcome and additional advantages are provided through, in one aspect, the provision of a cooling apparatus which comprises a vapor condenser. The vapor condenser includes a three-dimensional folded structure which defines, at least in part, a first set of coolant-carrying channels and a second set of vapor condensing channels, wherein the first set of coolant-carrying channels is interleaved with and extends parallel to the second set of vapor condensing channels. The three-dimensional folded structure includes a thermally conductive sheet with multiple folds therein. One side of the thermally conductive sheet comprises a vapor condensing surface, and the opposite side of the thermally conductive sheet comprises a coolant-cooled surface, wherein at least a portion of the coolant-cooled surface at least partially defines the first set of coolant-carrying channels.

In another aspect, a cooling apparatus is provided which includes a housing configured to facilitate forming a compartment, a fluid disposed within the compartment, and a vapor condenser. The vapor condenser includes a three-dimensional folded structure which defines, at least in part, a first set of coolant-carrying channels and a second set of vapor condensing channels. The first set of coolant-carrying channels is interleaved with and extends parallel to the second set of vapor condensing channels. The three-dimensional folded structure includes a thermally conductive sheet with multiple folds therein, wherein one side of the thermally conductive sheet comprises a vapor condensing surface, and the vapor condensing surface is exposed within the compartment in an upper portion thereof. The second set of vapor condensing channels increase a condensation surface area of the vapor condensing surface, and thereby facilitate cooling of fluid vapor rising to the upper portion of the compartment.

In another aspect, a liquid-cooled electronics rack is provided which includes a plurality of immersion-cooled electronic subsystems and a vapor condenser heat exchanger. At least one immersion-cooled electronics system includes a housing, a dielectric fluid, and a dielectric fluid inlet and dielectric fluid vapor outlet. The housing at least partially surrounds and forms a compartment about an electronic subsystem, which comprises at least one electronic component to be cooled. The dielectric fluid is disposed within the compartment, and the at least one electronic component to be cooled is at least partially immersed within the dielectric fluid. The dielectric fluid inlet and dielectric fluid vapor outlet are in fluid communication with the compartment, and dielectric fluid is provided to the compartment via the dielectric fluid inlet, and dielectric fluid vapor egresses from the compartment to the vapor condenser heat exchanger via the dielectric fluid vapor outlet. The vapor condenser heat exchanger facilitates condensing of dielectric fluid vapor egressing from the compartment(s) of the at least one immersion-cooled electronic subsystem. The vapor condenser heat exchanger comprises a three-dimensional folded structure defining, at least in part, a first set of coolant-carrying channels and a second set of vapor condensing channels. The first set of coolant-carrying channels are interleaved with an extend parallel to the second set of vapor condensing channels. The three-dimensional folded structure includes a thermally conductive sheet with multiple folds therein, wherein one side of the thermally conductive sheet comprises a vapor condensing surface, and an opposite side of the thermally conductive sheet comprises a coolant-cooled surface. At least a portion of the coolant-cooled surface at least partially defines the first set of coolant-carrying channels, and coolant within the first set of coolant-carrying channels at least partially contacts the coolant-cooled surface of the thermally conductive sheet of the three-dimensional folded structure.

In a further aspect, a method of fabricating a cooling apparatus is provided which includes fabricating a vapor condenser. Fabricating the vapor condenser comprises: obtaining a three-dimensional folded structure defining, at least in part, a first set of coolant-carrying channels and a second set of vapor condensing channels of the vapor condenser, the first set of coolant-carrying channels being interleaved with and extending parallel to the second set of vapor condensing channels, wherein the three-dimensional folded structure comprises a thermally conductive sheet with multiple folds therein, wherein one side of the thermally conductive sheet comprises a vapor condensing surface, and an opposite side of the thermally conductive sheet comprises a coolant-cooled surface, at least a portion of the coolant-cooled surface at least partially defining the first set of coolant-carrying channels; disposing a first end manifold at a first end of the three-dimensional folded structure and a second end manifold at a second, opposite end of the three-dimensional manifold structure, the first end manifold and the second end manifold comprising openings in fluid communication with the first set of coolant-carrying channels of the three-dimensional folded structure to facilitate flow of coolant through the first set of coolant-carrying channels; and coupling a plate to the coolant-cooled surface side of the thermally conductive sheet with the multiple folds, wherein the plate and the thermally conductive sheet with the multiple folds therein define the first set of coolant-carrying channels of the three-dimensional folded structure.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
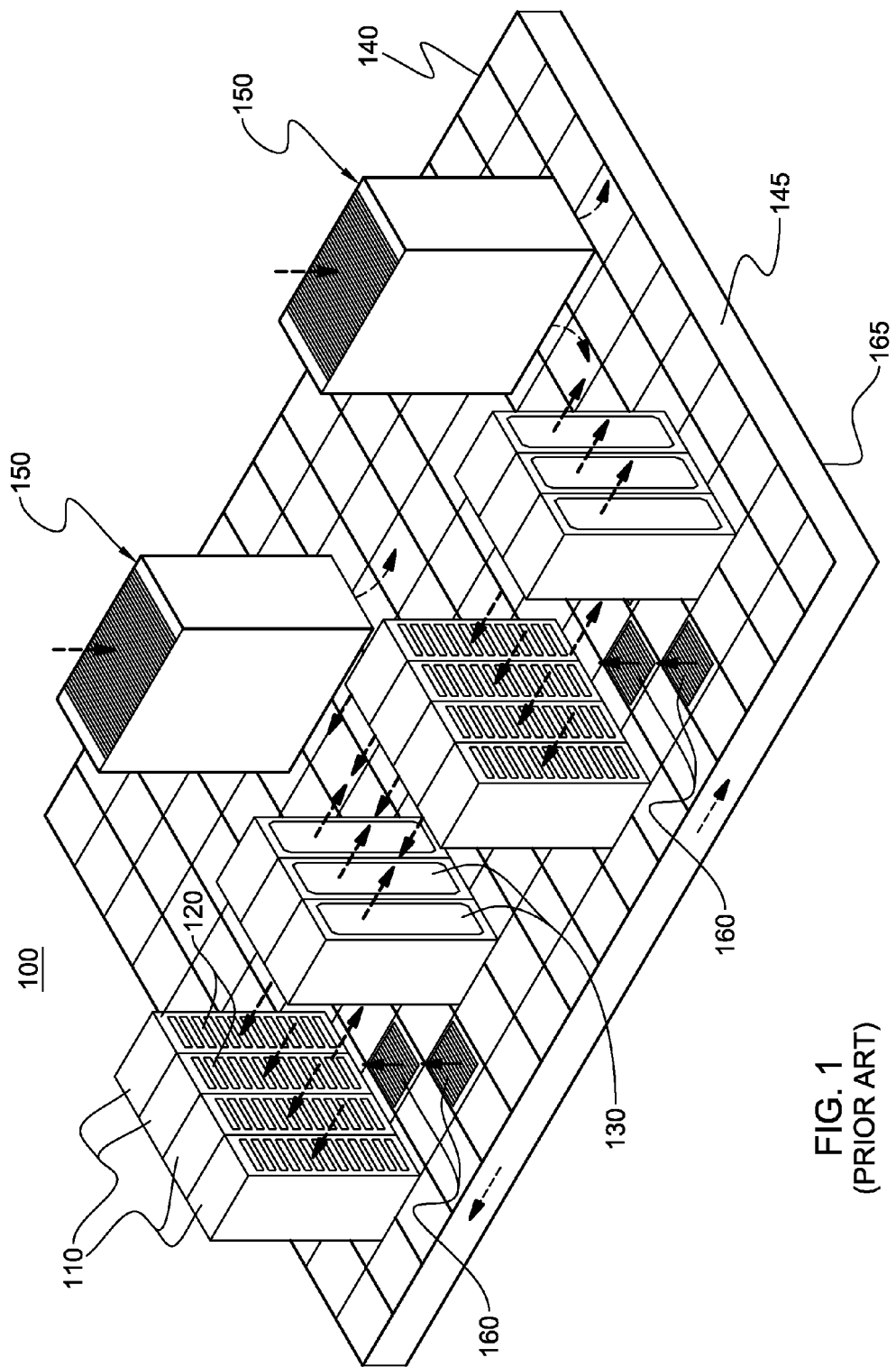
FIG. 1. depicts one embodiment of a conventional raised floor layout of an air-cooled data center.

As used herein, the terms "electronics rack", "rack-mounted electronic equipment", and "rack unit" are used interchangeably, and unless otherwise specified include any housing, frame, rack, compartment, blade server system, etc., having one or more heat-generating components of a computer system, electronic system, or information technology equipment, and may be, for example, a stand-alone computer processor having high-, mid- or low-end processing capability. In one embodiment, an electronics rack may comprise one or more electronic subsystems. "Electronic subsystem" refers to any sub-housing, blade, book, drawer, node, compartment, board, etc., having one or more heat-generating electronic components disposed therein or thereon. An electronic subsystem of an electronics rack may be movable or fixed relative to the electronics rack, with the rack-mounted electronic drawers of a rack unit and blades of a blade center system being two examples of subsystems of an electronics rack to be cooled. In one embodiment, electronic subsystem refers to an electronic system or a portion of an electronic system which comprises multiple electronic components of the same or different types, and may be, in one example, a server unit.

"Electronic component" refers to any heat generating electronic component of, for example, a computer system or other electronic unit requiring cooling. By way of example, an electronic component may comprise one or more integrated circuit dies and/or other electronic devices to be cooled, including one or more processor dies, memory dies or memory support dies. As a further example, the electronic component may comprise one or more bare dies or one or more packaged dies disposed on a common carrier. Further, unless otherwise specified herein, the terms "liquid-cooled cold plate", "liquid-cooled base plate", or "liquid-cooled structure" each refer to any conventional thermally conductive structure having a plurality of channels or passageways formed therein for flowing of liquid-coolant therethrough.

As used herein, a "liquid-to-liquid heat exchanger" may comprise, for example, two or more coolant flow paths, formed of thermally conductive tubing (such as copper or other tubing) in thermal or mechanical contact with each other. Size, configuration and construction of the liquid-to-liquid heat exchanger can vary without departing from the scope of the invention disclosed herein. Further, "data center" refers to a computer installation containing, for example, one or more electronics racks to be cooled. As a specific example, a data center may include one or more rows of rack-mounted computing units, such as server units.

One example of facility coolant and system coolant is water. However, the concepts disclosed herein are readily adapted to use with other types of coolant on the facility side and/or on the system side. For example, one or more of these coolants may comprise a brine, a dielectric liquid, a fluorocarbon liquid, a liquid metal, or other similar coolant, or refrigerant, while still maintaining the advantages and unique features of the present invention.

Reference is made below to the drawings, which are not drawn to scale for ease of understanding, wherein the same reference numbers used throughout different figures designate the same or similar components.

FIG. 1 depicts a raised floor layout of an air cooled data center 100 typical in the prior art, wherein multiple electronics racks 110 are disposed in one or more rows. A data center such as depicted in FIG. 1 may house several hundred, or even several thousand microprocessors. In the arrangement illustrated, chilled air enters the computer room via perforated floor tiles 160 from a supply air plenum 145 defined between the raised floor 140 and a base or sub-floor 165 of the room. Cooled air is taken in through louvered covers at air inlet sides 120 of the electronics racks and expelled through the backs, that is, air outlet sides 130, of the electronics racks. Each electronics rack 110 may have one or more air moving devices (e.g., fans or blowers) to provide forced inlet-to-outlet airflow to cool the electronic devices within the subsystem(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within data center 100. Room air is taken into each air conditioning unit 150 near an upper portion thereof. This room air may comprise in part exhausted air from the "hot" aisles of the computer installation defined, for example, by opposing air outlet sides 130 of electronics racks 110.

Figure 2:
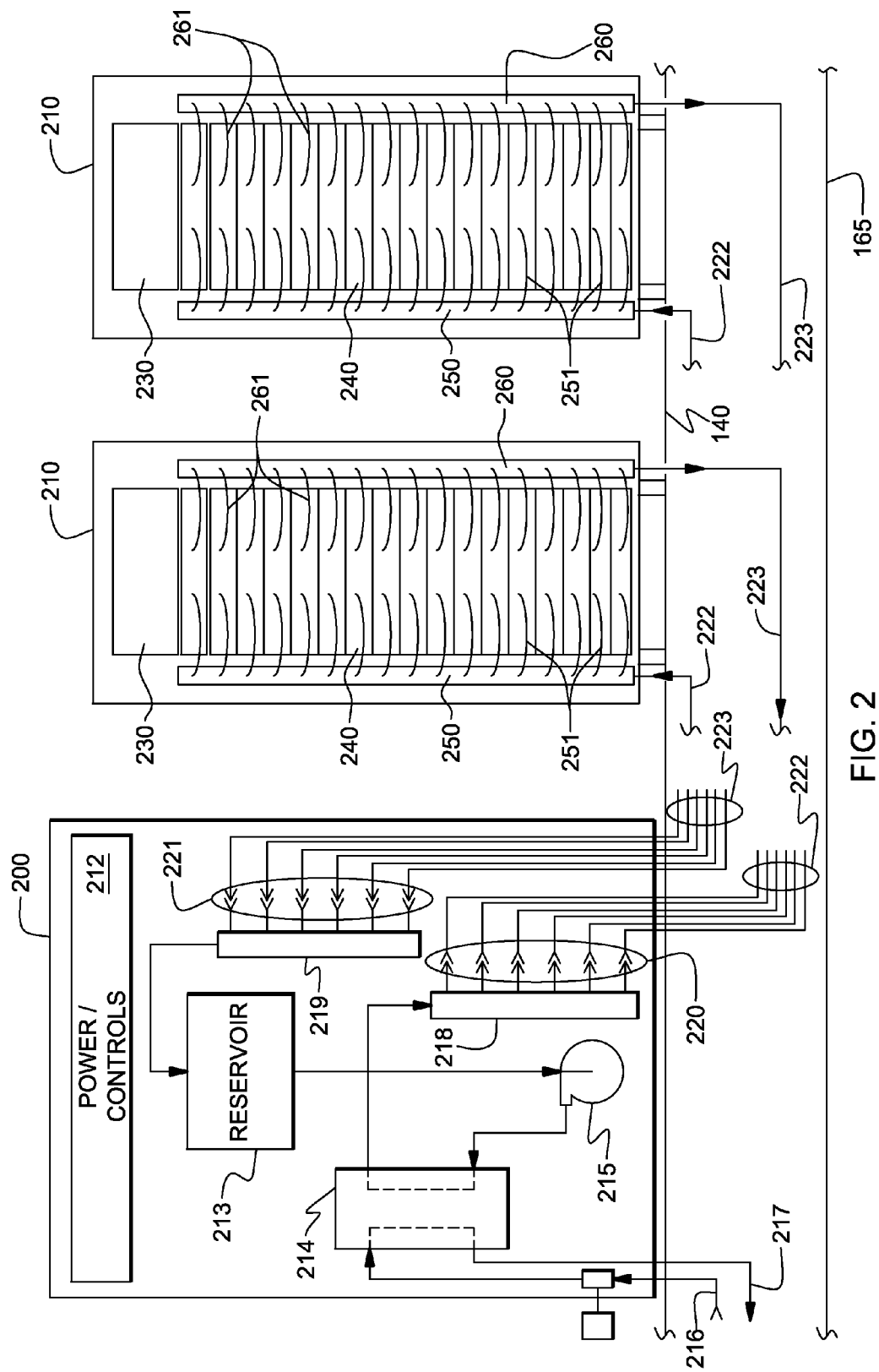
FIG. 2 depicts one embodiment of a coolant distribution unit facilitating liquid-cooling of electronics racks of a data center, in accordance with one or more aspects of the present invention.
Figure 3:
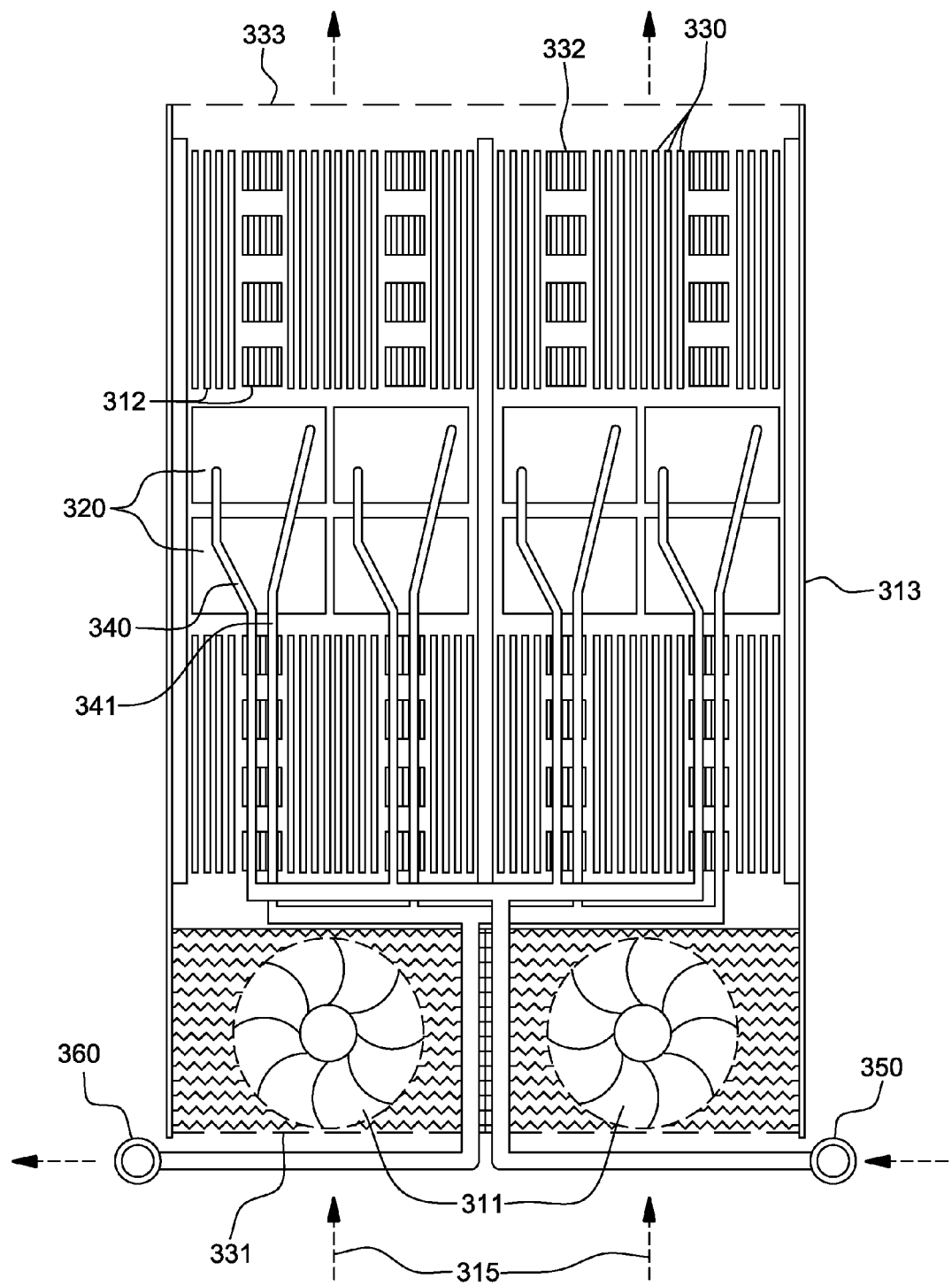
FIG. 3 is a plan view of one embodiment of an electronic subsystem (or node) layout, illustrating an air and liquid-cooling apparatus for cooling components of the electronic subsystem, in accordance with one or more aspects of the present invention.
Figure 4A:
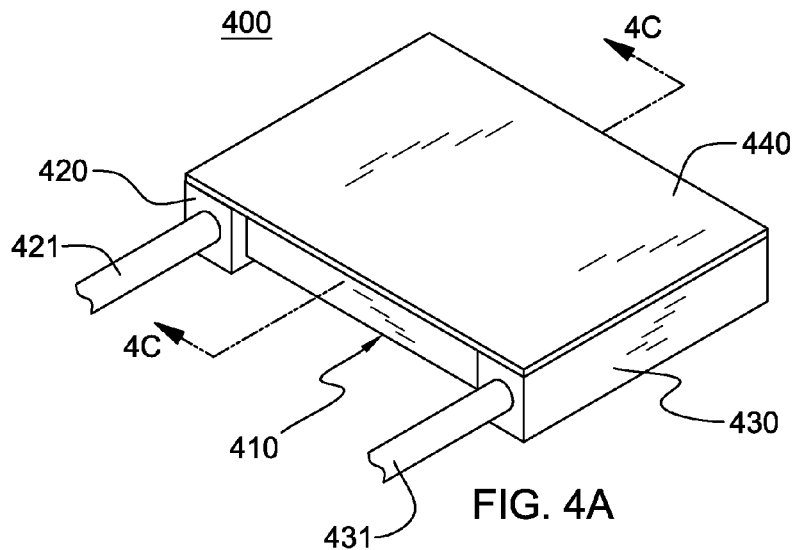
FIG. 4A depicts one embodiment of a vapor condenser, in accordance with one or more aspects of the present invention.
Figure 4B:
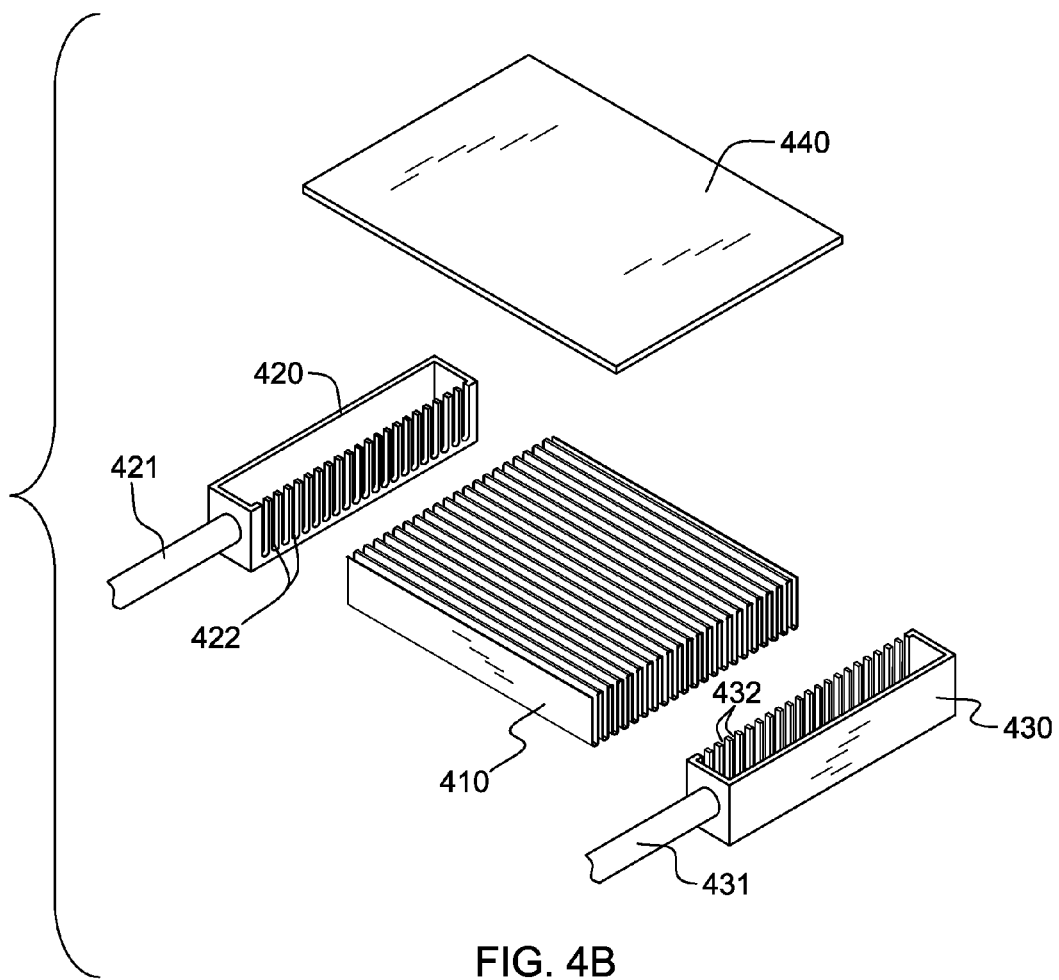
FIG. 4B depicts a partially exploded view of the vapor condenser of FIG. 4A, in accordance with one or more aspects of the present invention.
Figure 4C:
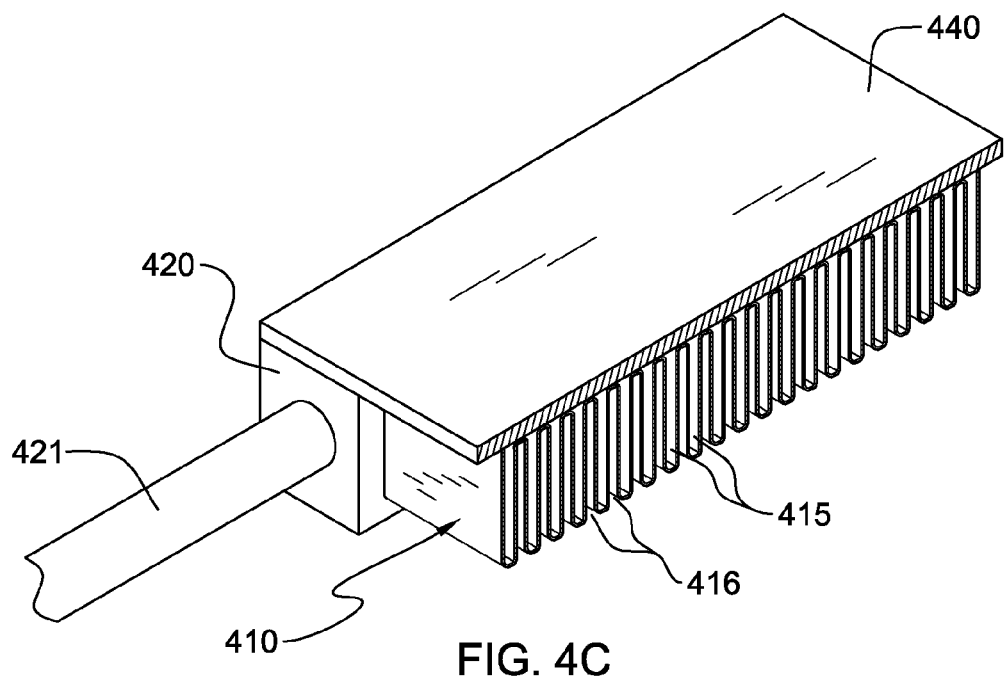
FIG. 4C depicts an enlarged, cross-sectional view of the vapor condenser of FIG. 4A, taken along line 4C-4C thereof, in accordance with one or more aspects of the present invention.
Figure 4D:
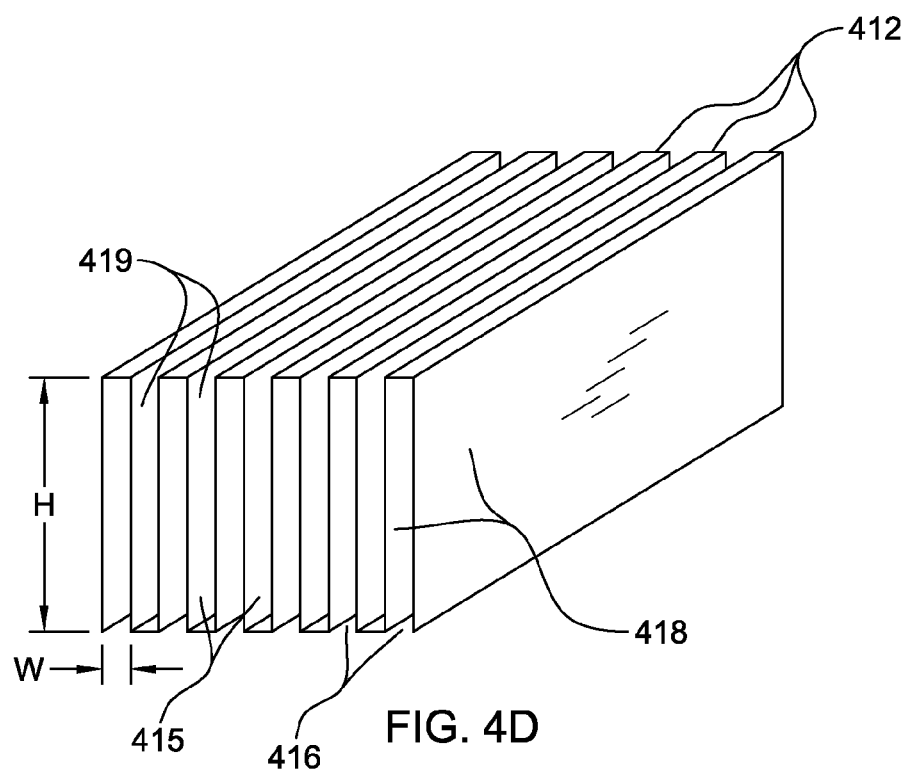
FIG. 4D depicts one embodiment of the three-dimensional folded structure of the vapor condenser of FIGS. 4A-4C, illustrating one example of multiple folds in the thermally conductive sheet thereof, in accordance with one or more aspects of the present invention.

Due to the ever-increasing airflow requirements through electronics racks, and the limits of air distribution within the typical data center installation, liquid-based cooling is being combined with the above-described conventional air-cooling. FIGS. 2-3 illustrate one embodiment of a data center implementation employing a hybrid air- and liquid-based cooling system with one or more cold plates coupled to high heat-generating electronic devices disposed within the electronics racks.

FIG. 2 depicts one embodiment of a coolant distribution unit 200 for a data center. Within coolant distribution unit 200 is a power/control element 212, a reservoir/expansion tank 213, a heat exchanger 214, a pump 215 (often accompanied by a redundant second pump), facility water inlet 216 and outlet 217 supply pipes, a supply manifold 218 supplying water or system coolant to the electronics racks 210 via couplings 220 and lines 222, and a return manifold 219 receiving water from the electronics racks 210, via lines 223 and couplings 221. Each electronics rack includes (in one example) a power/control unit 230 for the electronics rack, multiple electronic subsystems 240, a system coolant supply manifold 250, and a system coolant return manifold 260. In this embodiment, each electronics rack 210 is disposed on raised floor 140 of the data center, with lines 222 providing system coolant to system coolant supply manifolds 250 and lines 223 facilitating return of system coolant from system coolant return manifolds 260 shown disposed in the supply air plenum beneath the raised floor.

In the embodiment illustrated, the system coolant supply manifold 250 provides system coolant to the cooling systems of the electronic subsystems (more particularly, for example, to liquid-cooled cold plates thereof) via flexible hose connections 251, which are disposed between the supply manifold and the respective electronic subsystems within the rack. Similarly, system coolant return manifold 260 is coupled to the electronic subsystems via flexible hose connections 261. Quick connect couplings may be employed at the interface between flexible hoses 251, 261 and the individual electronic subsystems. By way of example, these quick connect couplings may comprise various types of commercially available couplings, such as those available from Colder Products Company, of St. Paul, Minn., USA, or Parker Hannifin, of Cleveland, Ohio, USA.

Although not shown, electronics rack 210 may also include an air-to-liquid heat exchanger disposed at an air outlet side thereof, which also receives system coolant from the system coolant supply manifold 250 and returns system coolant to the system coolant return manifold 260.

FIG. 3 depicts one embodiment of an electronic subsystem 313 component layout wherein one or more air moving devices 311 provide forced air flow 315 to cool multiple components 312 within electronic subsystem 313. Cool air is taken in through a front 331 and exhausted out a back 333 of the subsystem. The multiple components to be cooled include multiple processor modules to which liquid-cooled cold plates 320 (of a liquid-based cooling system) are coupled, as well as multiple arrays of memory modules 330 (e.g., dual in-line memory modules (DIMMs)) and multiple rows of memory support modules 332 (e.g., DIMM control modules) to which air-cooled heat sinks are coupled. In the embodiment illustrated, memory modules 330 and the memory support modules 332 are partially arrayed near front 331 of electronic subsystem 313, and partially arrayed near back 333 of electronic subsystem 313. Also, in the embodiment of FIG. 3, memory modules 330 and the memory support modules 332 are cooled by air flow 315 across the electronic subsystem.

The illustrated liquid-based cooling system further includes multiple coolant-carrying tubes 340, 341 connected to and in fluid communication with liquid-cooled cold plates 320. The coolant-carrying tubes 340, 341 comprise coolant supply tubes 340 and coolant return tubes 341, which are respectively in fluid communication with a system coolant supply manifold 350 and a system coolant return manifold 360. In this manner, system coolant is circulated through electronic subsystem 313, and in particular, liquid-cooled cold plates 320 thereof, to facilitate removal of heat from high-heat-generating components of the electronic subsystem, such as processor modules disposed within the subsystem.

As computing demands continue to increase, heat dissipation requirements of electronic components, such as microprocessors and memory modules, are also rising. This has motivated the development of the application of single-phase, liquid-cooling solutions such as described above. Single-phase, liquid-cooling, however, has some issues. Sensible heating of the liquid as it flows along the cooling channels and across components connected in series results in a temperature gradient. To maintain a more uniform temperature across the heat-generating component, the temperature change in the liquid needs to be minimized. This requires the liquid to be pumped at higher flow rates, consuming more pump power, and thus leading to a less efficient system. Further, it is becoming increasingly challenging to cool all the heat sources on a server or electronic subsystem using pumped liquid, due to the density and number of components, such as controller chips, I/O components and memory modules. The small spaces and number of components to be cooled may make liquid plumbing a complex design and fabrication problem and raise the overall cost of the cooling solution.

Immersion-cooling is one possible solution to these issues. In immersion-cooling, one or more components to be cooled are immersed in a dielectric fluid that dissipates heat through boiling. The vapor is then condensed by a secondary, rack-level working fluid using node or module-level, vapor condensers, as explained below.

Direct immersion-cooling of electronic components of an electronic subsystem of a rack unit using dielectric fluid (e.g., a liquid dielectric coolant) advantageously avoids forced air cooling and enables total liquid-cooling of the electronics rack within the data center. Although indirect liquid-cooling, such as described above in connection with FIGS. 2 & 3, has certain advantages due to the low cost and wide availability of water as a coolant, as well as its superior thermal and hydraulic properties, where possible and viable, the use of dielectric fluid immersion-cooling may offer several unique benefits.

For example, the use of a dielectric fluid that condenses at a temperature above typical outdoor ambient air temperature would enable data center cooling architectures which do not require energy intensive refrigeration chillers. Yet other practical advantages, such as the ability to ship a coolant filled electronic subsystem, may offer benefit over water-cooled approaches such as depicted in FIGS. 2 & 3, which require shipping dry and the use of a fill and drain protocol to insure against freeze damage during transport. Also, the use of liquid immersion-cooling may, in certain cases, allow for greater compaction of electronic components at the electronic subsystem level and/or electronic rack level since conductive cooling structures might be eliminated. Unlike corrosion sensitive water-cooled systems, chemically inert dielectric coolant (employed with an immersion-cooling approach such as described herein) would not mandate copper as the primary thermally conductive wetted metal. Lower cost and lower mass aluminum structures could replace copper structures wherever thermally viable, and the mixed wetted metal assemblies would not be vulnerable to galvanic corrosion, such as in the case of a water based cooling approach. For at least these potential benefits, dielectric fluid immersion-cooling of one or more electronic subsystems of an electronics rack may offer significant energy efficiency and higher performance cooling benefits, compared with currently available hybrid air and indirect water cooled systems.

In the examples discussed below, the dielectric fluid may comprise any one of a variety of commercially available dielectric coolants. For example, any of the Fluorinert™ or Novec™ fluids manufactured by 3M Corporation (e.g., FC-72, FC-86, HFE-7000, and HFE-7200) could be employed. Alternatively, a refrigerant such as R-134a or R-245fa may be employed if desired.

With immersion-cooled electronic modules or immersion-cooled electronic subsystems, a vapor condenser may be integrated with the module or subsystem to facilitate extraction of heat form the immersion-cooled module or system using a dielectric fluid boiling and condensing process. FIGS. 4A-7 depict an enhanced embodiment of a vapor condenser and the use thereof in an immersion-cooled electronic module, an immersion-cooled electronic subsystem, or an electronics rack.

FIGS. 4A-4D depict one embodiment of a vapor condenser 400, comprising a three-dimensional folded structure 410, which is alternately referred to herein as a folded fin. Referring collectively to FIGS. 4A-4D, vapor condenser 400 is shown (in one embodiment) to comprise three-dimensional folded structure 410, a first end manifold 420, a second manifold 430, and a top plate 440. The first and second end manifolds 420, 430 are disposed at opposite ends of three-dimensional folded structure 410, and top plate 440 overlies three-dimensional folded structure 410 and the first and second end manifolds 420, 430, that is, in the embodiment depicted.

In one embodiment, three-dimensional folded structure 410 comprises a thermally conductive sheet 411, with multiple folds 412 thereof which facilitate defining a first set of coolant-carrying channels 415 and a second set of vapor condensing channels 416. The first set of coolant-carrying channels 415 are interleaved with and extend parallel to the second set of vapor condensing channels 416. In one embodiment, the folds 412 of the thermally conductive sheet 411 comprise a repeating pattern of folds such that the coolant-carrying channels have substantially the same transverse cross-sectional area as the vapor condensing channels. Note that this is depicted by way of example only. In one or more alternate embodiments, one or more of the coolant-carrying channels may have a different transverse cross-sectional area compared with one or more of the vapor condensing channels. Further, note that one or more of the coolant-carrying channels or the vapor condensing channels may have different transverse cross-sectional configurations. For example, the transverse cross-sectional area of the first set of coolant-carrying channels and the second set of vapor condensing channels could be square-shaped, or triangular-shaped, in alternate embodiments. However, the high aspect ratio, rectangular-shaped, transverse cross-sectional areas for the first set of coolant-carrying channels and the second set of vapor condensing channels advantageously provides for increased heat transfer by increasing the vapor condensing surface area, and increasing the coolant-cooled surface area.

In the depicted example, the vapor condensing channels 416 are open at the bottom to allow fluid vapor to rise into the vapor condensing channels, and the channels comprise a height 'H' significantly greater than a width 'W', such that the transverse cross-section of the vapor condensing channels has the desired high aspect ratio of height to width. For example, the height may be greater than two times, five times, or even ten times or more the width of the vapor condensing channel in order to increase vapor condensing surface area.

As noted, thermally conductive sheet 411 is a folded fin structure, and includes a vapor condensing surface 418 on one side of the thermally conductive sheet, and a coolant-cooled surface 419 on an opposite side of the thermally conductive sheet 411. The coolant-cooled surface 419 at least partially defines the first set of coolant-carrying channels 415. In one embodiment, the first set of coolant-carrying channels is defined by top plate 440 and the three-dimensional folded structure 410, and coolant within the first set of coolant-carrying channels is at least partially in contact with the coolant-cooled surface 419 of the thermally conductive sheet 411 of the three-dimensional folded structure 410. Further, first end manifold 420 may be (for example) a coolant supply manifold in fluid communication with a coolant supply line 421, and second end manifold 430 may be a coolant return manifold in fluid communication with a coolant return line 431. The first end manifold 420 and second end manifold 430 comprise openings 422, 432, respectively, which align with and are in fluid communication with the first set of coolant-carrying channels 415 of the three-dimensional folded structure 410. In one embodiment, the thermally conductive sheet 411 may be a folded fin fabricated of a metal material, and folded or bent to achieve the desired folded configuration of interleaved coolant-carrying channels and vapor condensing channels. In an alternate embodiment, the thermally conductive sheet material could comprise a thermally conductive plastic molded into the desired folded fin configuration. Once fabricated, the folded fin may be physically attached to the first end manifold 420 and second end manifold 430, and (for example) brazed, soldered, welded, or otherwise securely attached to the manifolds, so as to form a fluid-tight connection between the manifolds and the first set of coolant-carrying channels 415 of the folded fin.

Advantageously, the vapor condensing surface of the thermally conductive sheet is in thermal contact with the coolant-cooled surface of the thermally conductive sheet via the thickness of the thermally conductive sheet. By appropriately selecting the thickness and material for the thermally conductive sheet of the three-dimensional folded structure, good thermal conduction between the vapor condensing surface and the coolant-cooled surface can be achieved. As noted, in one implementation, the folded fin structure is fabricated from a sheet of metal using a bending machine. Bending machines exist which may be employed to manufacture folded fin arrays of different geometries, such as the geometry depicted in FIGS. 4A-4D. In one implementation, the coolant provided via first and second end manifolds 420, 430 is water, with the water passing through the coolant-carrying channels (or passages) cooling vapor that may be in contact with the vapor condensing surface of the sheet or fin.

Figure 5A:
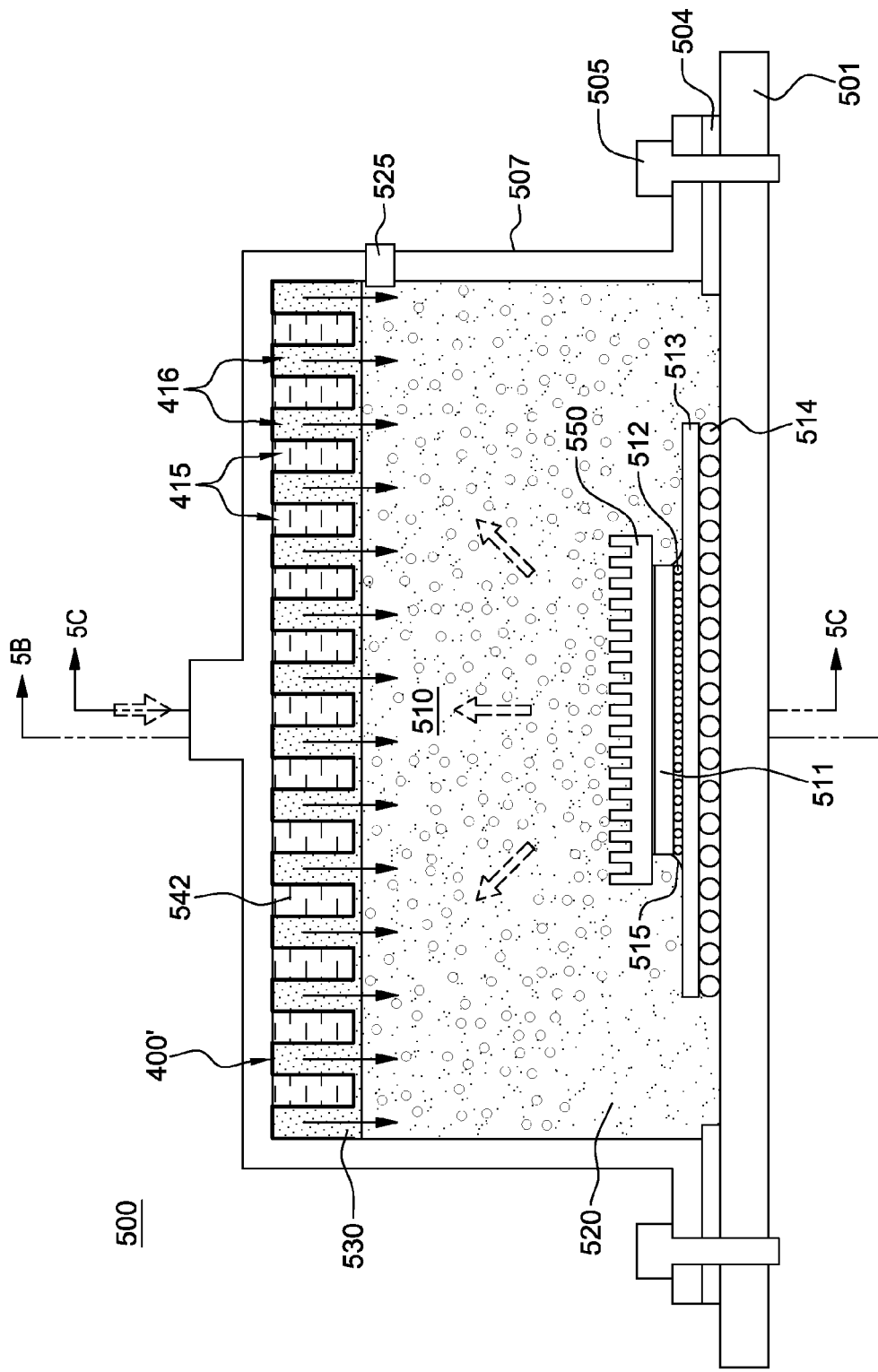
FIG. 5A is a cross-sectional elevational view of one embodiment of a cooled electronic module, taken along line 5A-5A of FIG. 5C, and comprising an electronic component to be cooled and a cooling apparatus, in accordance with one or more aspects of the present invention.

FIGS. 5A-7 depict various cooling apparatus implementations using a vapor condenser such as depicted in FIGS. 4A-4D. By way of example, the vapor condenser of FIGS. 4A-4D is illustrated in FIGS. 5A-5C as part of a cooled electronic module, in FIGS. 6A & 6B within immersion-cooled electronic subsystems, and in FIG. 7 in a rack-level, vapor condensing heat exchanger cooling dielectric vapor egressing from a plurality of immersion-cooled electronic subsystems of the rack.

Figure 5B:
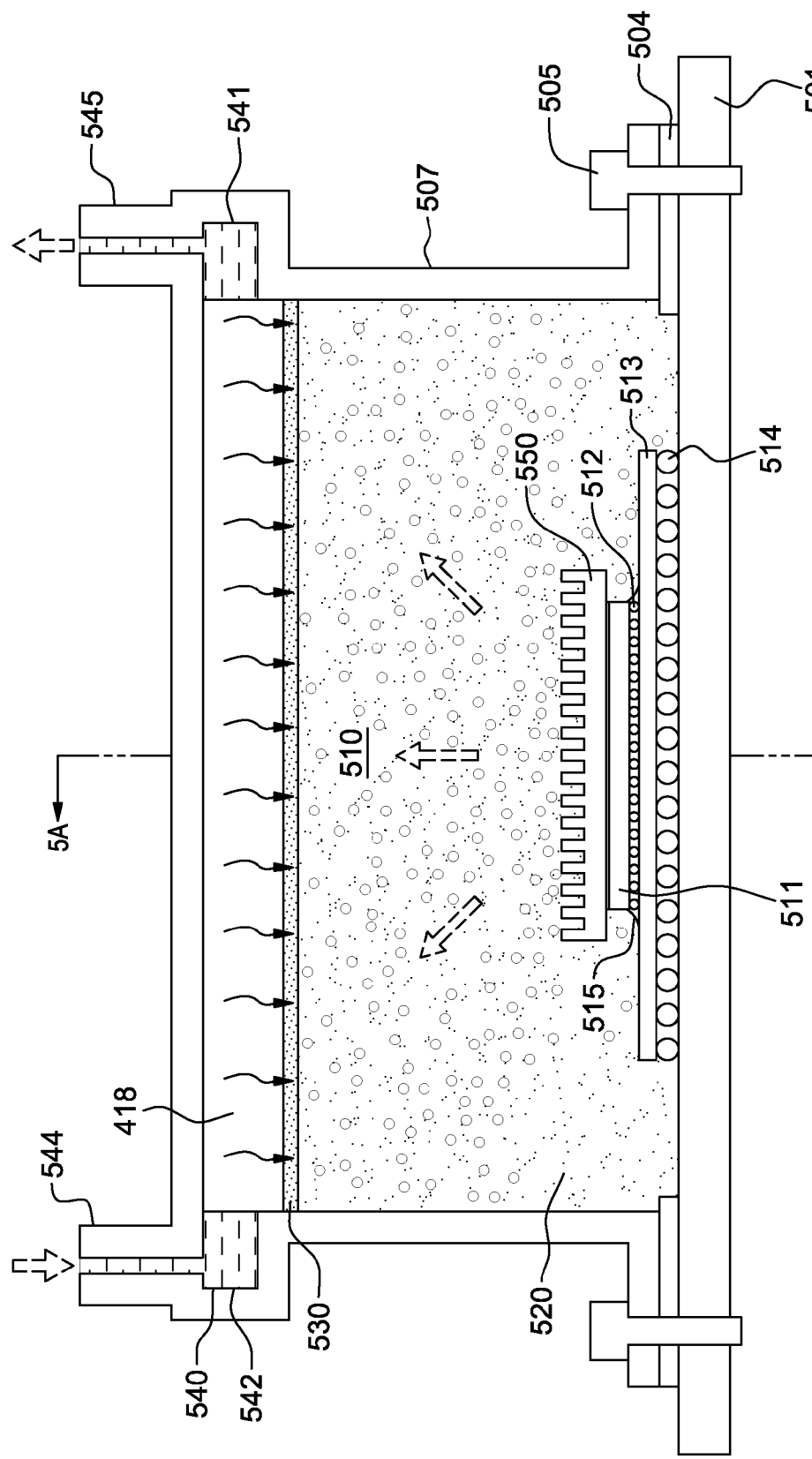
FIG. 5B is a cross-sectional elevational view of the cooled electronic module of FIG. 5A, taken along line 5B-5B thereof, in accordance with one or more aspects of the present invention.
Figure 5C:
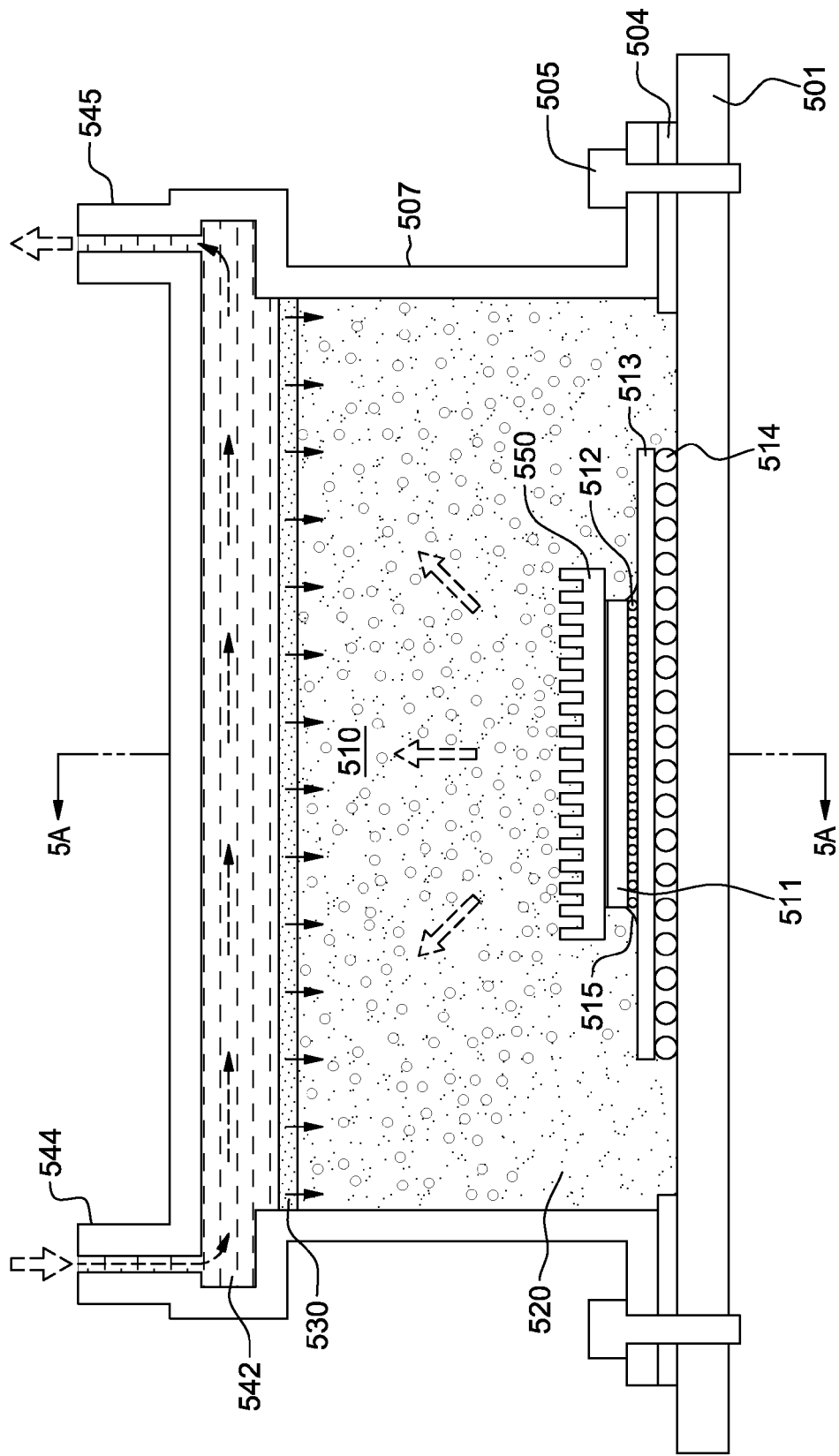
FIG. 5C is a further cross-sectional elevational view of the cooled electronic module of FIG. 5A, taken along line 5C-5C thereof, in accordance with one or more aspects of the present invention.

As noted, FIGS. 5A-5C depict one embodiment of a cooled electronic module, generally denoted 500, in accordance with one or more aspects of the present invention. Cooled electronic module 500 includes, in this embodiment, an electronic component 511, such as an electronic chip or package, coupled to a printed circuit board 501 through chip carrier or substrate 513. A cooling apparatus comprising a housing (or casing) 507 is mechanically coupled via securing mechanisms 505 to board 501.

As shown, housing 507 is configured to at least partially surround and form a compartment 510 about electronic component 511 to be cooled. In this embodiment, electronic component 511 is connected to chip carrier (or substrate) 513 via, for example, a first plurality of solder ball connections 512. Substrate 513 is electrically connected to printed circuit board 501 via, for example, a second plurality of solder ball connections 514 (and an underfill material). An underfill material 515 surrounds the first plurality of solder ball connections 512, and seals the working fluid 520 within compartment 510 from the first plurality of electrical connections and, in one embodiment, the active surface of the electronic component 511 disposed in spaced, opposing relation to substrate 513.

The housing 507 is a shell-like component that is attached to, for example, printed circuit board 501 using securing mechanisms 505, such as bolts or screws, and a sealing gasket 504, which is compressed between a lower surface of the housing and an upper surface of the board, or alternatively, between a lower surface of the housing and an upper surface of substrate 513, to which electronic component 511 directly couples. Note that as used herein, the word "substrate" refers to any underlying supporting structure, such as substrate 513 or printed circuit board 501 to which the electronic component is coupled, and to which the housing may be sealed in order to form a fluid-tight compartment 510 about the electronic component. Sealing gasket 504 seals off the compartment of the housing and assists in retaining the fluid 520 within the sealed compartment.

As depicted, cooled electronic module 500 further includes a liquid-cooled vapor condenser 400' in a vapor condensing region 530, disposed in an upper portion of the compartment 510. Vapor condenser 400' is integrated with housing 507, and comprises, in this embodiment, a set of coolant-carrying channels 415 through which a coolant (such as water) circulates, as described above in connection with FIGS. 4A-4D. Coolant 542 passes into the liquid-cooled vapor condenser through an inlet 544 and egresses through an outlet 545, which in this embodiment are in fluid communication with first and second end manifolds 540, 541, of vapor condenser 400'. Note that in this embodiment, first and second end manifolds 540, 541 are analogous to the first and second end manifolds 420, 430 depicted in FIGS. 4A-4D, and described above. The manifolds are separately identified in FIGS. 5A-5C since in the embodiment depicted, they are integrated with housing 507, and the inlets and outlets 544, 545 are separately identified from those depicted in FIGS. 4A-4D since they extend vertically from the electronic module, whereas in the embodiment of FIGS. 4A-4D, the supply and return lines 421, 431 extend laterally. Otherwise, vapor condenser 400' of FIGS. 5A-5C is substantially identical to that described above in connection with FIGS. 4A-4D, and includes a three-dimensional folded structure with the first set of coolant-carrying channels 415 and second set of vapor condensing channels 416 as described above.

In one embodiment, the vapor condensing channels 416 have a transverse cross-sectional area configured for the anticipated layer of vapor 530 to form in the upper portion of the sealed compartment with operation of the heat-generating electronic component. In particular, a pool of fluid, such as dielectric fluid, resides over the one or more electronic components within the compartment in operational state. A boiling heat sink 550 may be attached to the electronic component(s) to provide enhanced area for heat transfer. As the liquid fluid 520 absorbs heat, it undergoes phase change from liquid phase to vapor phase, and thus utilizes its latent heat of vaporization for cooling purposes. The fluid vapor generated travels upwards in the compartment due to the fact that it possesses a much lower density compared to the surrounding liquid. Upon reaching the upper portion of the sealed compartment, the fluid vapor contacts the cool vapor condensing surface 418 (FIG. 5B). Upon making contact with the cool, vapor condensing surfaces, the fluid vapor undergoes a phase change process from vapor to liquid state, and the liquid droplets fall back downwards due to gravity and the liquid's relatively higher density compared with the neighboring vapor region. As long as the boiling and condensation cooling processes are in equilibrium, and are commensurate with the heat generated by the one or more electronic components, the cooling apparatus depicted in FIGS. 5A-5C will successfully transport heat from the electronic component to coolant flowing through the vapor condenser. Note that at the very top, inside of the compartment, there may be a thin layer made up of non-condensable gases (such as air), which leave the liquid and travel upwards. These gases can reside in solution within the dielectric liquid, but once out-gassed through the boiling process, they cannot be returned to solution via the coolant condensation process. The liquid used inside the cooling module may be a dielectric fluid, so as not to cause short-circuiting of electric current on the various exposed parts of the electronic component and substrate. Note also, that in addition to cooling taking place from the electronic component and boiling heat sink, there is also heat transfer occurring from the substrate and any components within the enclosure that generate heat.

The use of a vapor condenser comprising a three-dimensional folded structure such as disclosed herein advantageously provides an enlarged surface area for heat transfer in a compact volume, while reducing the conduction resistance between the vapor condensing surface and the coolant-cooled surface of the folded structure, while providing for coolant channels, such as water channels, which can augment heat transfer on the coolant-cooled side, as well as providing the vapor condensing channels which facilitate vapor condensation.

Housing 507 may also comprise, in the illustrated embodiment, a fluid fill port 525, which may be employed to charge the cooled electronic module with, for example, dielectric fluid. The module can be charged with fluid by first pulling a vacuum through the fluid fill port 525, and then backfilling the compartment with the desired fluid charge. It is contemplated that once filled with fluid, the cooled electronic module will function without further servicing of the fluid.

Figure 6A:
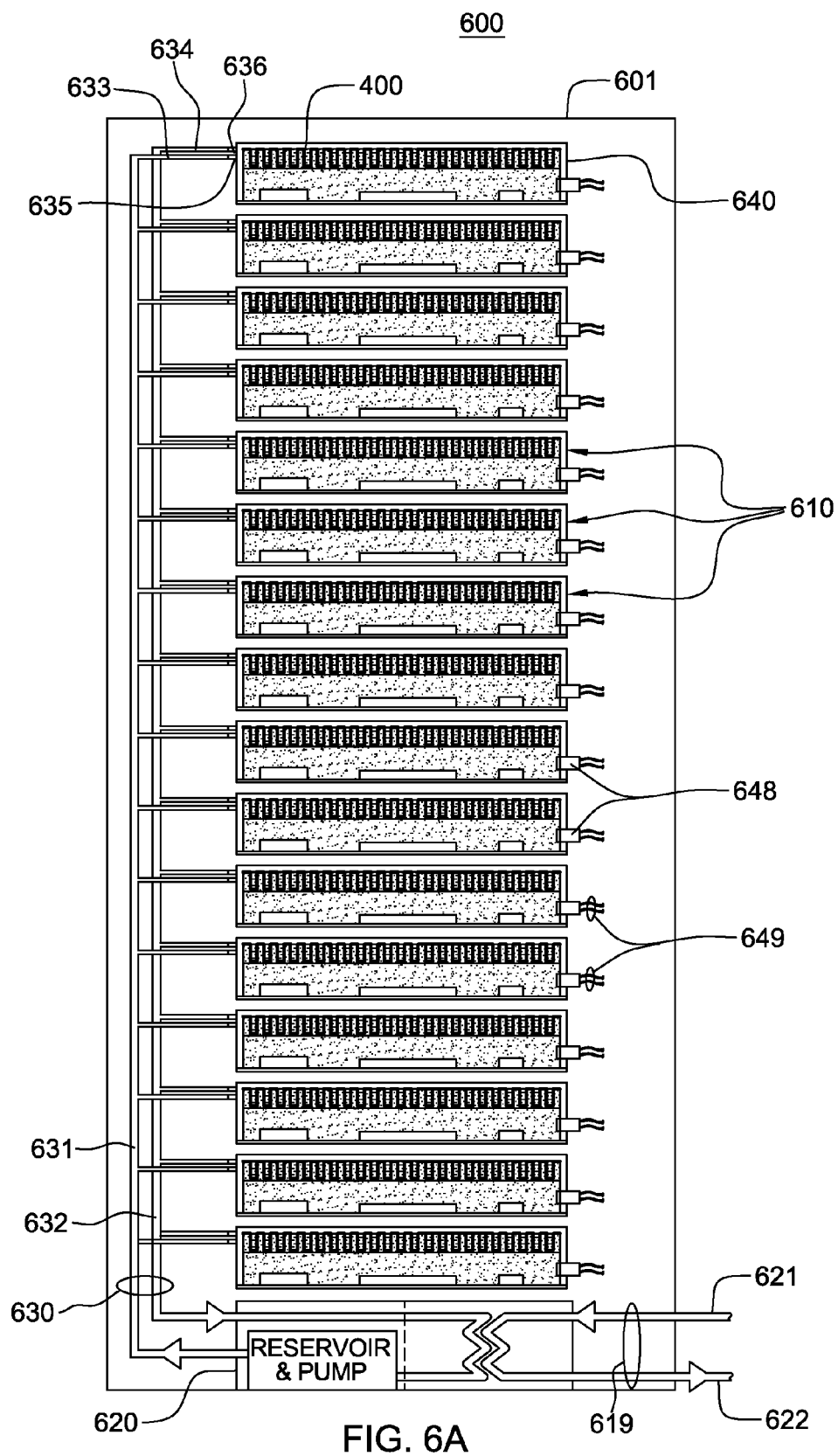
FIG. 6A is an elevational view of one embodiment of a liquid-cooled electronics rack with immersion-cooling of electronic subsystems thereof, and vapor condensing, in accordance with one or more aspects of the present invention.

FIG. 6A is a schematic of one embodiment of a liquid-cooled electronics rack, generally denoted 600, employing immersion-cooling of electronic subsystems, in accordance with an aspect of the present invention. As shown, liquid-cooled electronics rack 600 includes an electronics rack 601 containing a plurality of electronic subsystems 610 disposed, in the illustrated embodiment, horizontally so as to be stacked within the rack. By way of example, each electronic subsystem 610 may be a server unit of a rack-mounted plurality of server units. In addition, each electronic subsystem includes multiple electronic components to be cooled, which in one embodiment, comprise multiple different types of electronic components having different heights and/or shapes within the electronic subsystem.

The cooling apparatus is shown to include one or more modular cooling units (MCU) 620 disposed, by way of example, in a lower portion of electronics rack 601. The modular cooling unit 620 includes, for example, a liquid-to-liquid heat exchanger for extracting heat from coolant flowing through a system coolant loop 630 of the cooling apparatus and dissipating heat within a facility coolant loop 619, comprising a facility coolant supply line 621 and a facility coolant return line 622. As one example, facility coolant supply and return lines 621, 622 couple modular cooling unit 620 to a data center facility coolant supply and return (not shown). Modular cooling unit 620 further includes an appropriately sized reservoir, pump and optional filter for moving liquid-coolant under pressure through system coolant loop 630. In one embodiment, system coolant loop 630 includes a coolant supply manifold 631 and a coolant return manifold 632, which are coupled to modular cooling unit 620 via, for example, flexible hoses. The flexible hoses allow the supply and return manifolds to be mounted within, for example, a door of the electronics rack hingedly mounted to the front or back of the electronics rack. In one example, coolant supply manifold 631 and coolant return manifold 632 each comprise an elongated rigid tube vertically mounted to the electronics rack 601 or to a door of the electronics rack.

In the embodiment illustrated, coolant supply manifold 631 and coolant return manifold 632 are in fluid communication with respective coolant inlets 635 and coolant outlets 636 of individual sealed housings 640 containing the electronic subsystems 610. Fluid communication between the manifolds and the sealed housings is established, for example, via appropriately sized, flexible hoses 633, 634. In one embodiment, each coolant inlet 635 and coolant outlet 636 of a sealed housing is coupled to a respective (liquid-cooled) vapor condenser 400 disposed within the sealed housing 640. Heat removed from the electronic subsystem 610 via the respective vapor condenser 400 is transferred from the system coolant via the coolant outlet manifold 632 and modular cooling unit 620 to facility coolant loop 619. In one example, coolant passing through system coolant loop 630, and hence, coolant passing through the respective vapor condensers 400 is water. As noted above, vapor condenser 400 depicted in FIGS. 6A & 6B may be similar to that described above in connection with FIGS. 4A-4D.

Note that, in general, fluidic coupling between the electronic subsystems and coolant manifolds, as well as between the manifolds and the modular cooling unit(s) can be established using suitable hoses, hose barb fittings and quick disconnect couplers. In the example illustrated, the vertically-oriented coolant supply and return manifolds 631, 632 each include ports which facilitate fluid connection of the respective coolant inlets and outlets 635, 636 of the housings (containing the electronic subsystems) to the manifolds via the flexible hoses 633, 634. Respective quick connect couplings may be employed to couple the flexible hoses to the coolant inlets and coolant outlets of the sealed housings to allow for, for example, removal of a housing and electronic subsystem from the electronics rack.

One or more hermetically sealed electrical connectors 648 may also be provided in each sealed housing 640, for example, at a back surface thereof, for docking into a corresponding electrical plane of the electronics rack in order to provide electrical and network connections 649 to the electronic subsystem disposed within the sealed housing when the electronic subsystem is operatively positioned within the sealed housing and the sealed housing is operatively positioned within the electronics rack.

Figure 6B:
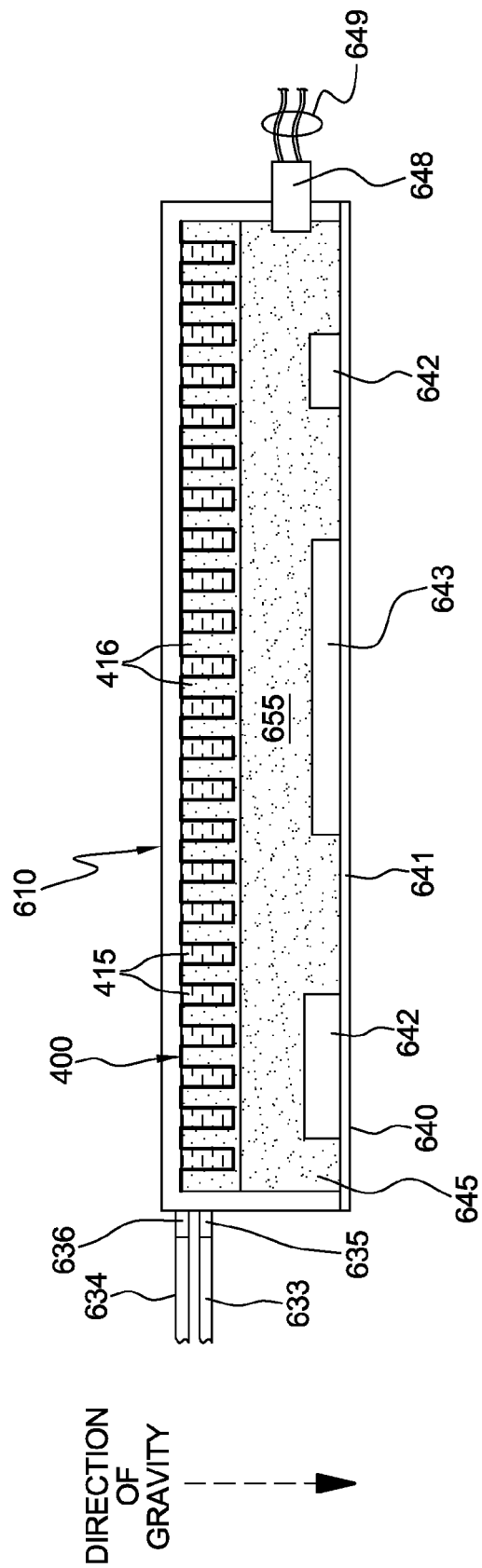
FIG. 6B is a cross-sectional elevational view of an immersion-cooled electronic subsystem of the liquid-cooled electronics rack of FIG. 6A, in accordance with one or more aspects of the present invention.

As illustrated in FIG. 6B, electronic subsystem 610 comprises a plurality of electronic components 642, 643 of different height and type on a substrate 641, and is shown within sealed housing 640 with the plurality of electronic components 642, 643 immersed within a dielectric fluid 645. Sealed housing 640 is configured to at least partially surround and form a sealed compartment about the electronic subsystem with the plurality of electronic components 642, 643 disposed within the sealed compartment. In an operational state, dielectric fluid 645 pools in the liquid state at the bottom of the sealed compartment and is of sufficient volume to submerge the electronic components 642, 643. The electronic components 642, 643 dissipate varying amounts of power, which cause the dielectric fluid to boil, releasing dielectric fluid vapor, which rises to the upper portion of the sealed compartment of the housing.

The upper portion of sealed housing 640 is shown in FIG. 6B to include vapor condenser 400. As noted, vapor condenser 400 is, in one embodiment, a vapor condenser such as described above in connection with FIGS. 4A-4D. This vapor condenser comprises a three-dimensional folded structure, with a first set of coolant-carrying channels 415 and a second set of vapor condensing channels 416 interleaved and extending parallel to each other. The different sets of channels are defined by a thermally conductive material folded into a three-dimensional folded structure so as to comprise a vapor condensing surface and a coolant-carrying surface of the material. In operation, dielectric fluid vapor contacts the cool vapor condensing surface of the three-dimensional folded structure of the vapor condenser 400 and condenses back to liquid phase, dropping downwards towards the bottom of the sealed compartment. Note that the size of the vapor condenser in the embodiment of FIGS. 6A & 6B may be larger than that for the cooled electronic module depicted in FIGS. 5A-5C, but that the overall configuration would be similar to that described above in connection with FIGS. 4A-4D. Coolant, such as water, is supplied to the vapor condenser within the immersion-cooled electronic subsystems, and passes through the respective sets of coolant-carrying channels to cool the vapor condensing surfaces of the three-dimensional folded structures.

In particular, system coolant supplied to the coolant inlet of the housing passes through the coolant-cooled channels of the vapor condenser and cools the solid material of the thermally conductive sheet, and thus cools the vapor condensing surface that is exposed within the sealed compartment. In one embodiment, the vapor condensing surface is cooled to a temperature well below the saturation temperature of the vapor. Thus, vapor in contact with the cool condensing surface will reject heat to that surface and condense back to liquid form. Based on operating conditions of the liquid-cooled vapor condenser 400, the condensed liquid may be close in temperature to the vapor temperature or could be sub-cooled to a much lower temperature.

Two-phase immersion-cooling of one or more electronic components can be limited by saturation temperatures and performance of the vapor condenser. For example, electronic-compatible fluids (e.g., dielectric fluids, such as fluorocarbons (FC) (such as FC-86, FC-87, FC-72) or segregated hydrofluoroether liquids (such as HFE-7000, HFE-7100, or HFE-7200), available from 3M Corporation, St. Paul Minn., U.S.A.) usable in immersion-cooling applications have specific boiling points based upon their chemistry. These boiling points are not always suitable for electronic cooling applications, and may need to be modified by pressurizing the immersion-cooling enclosure to alter the saturation pressure, and thus boiling temperature.

Figure 7:
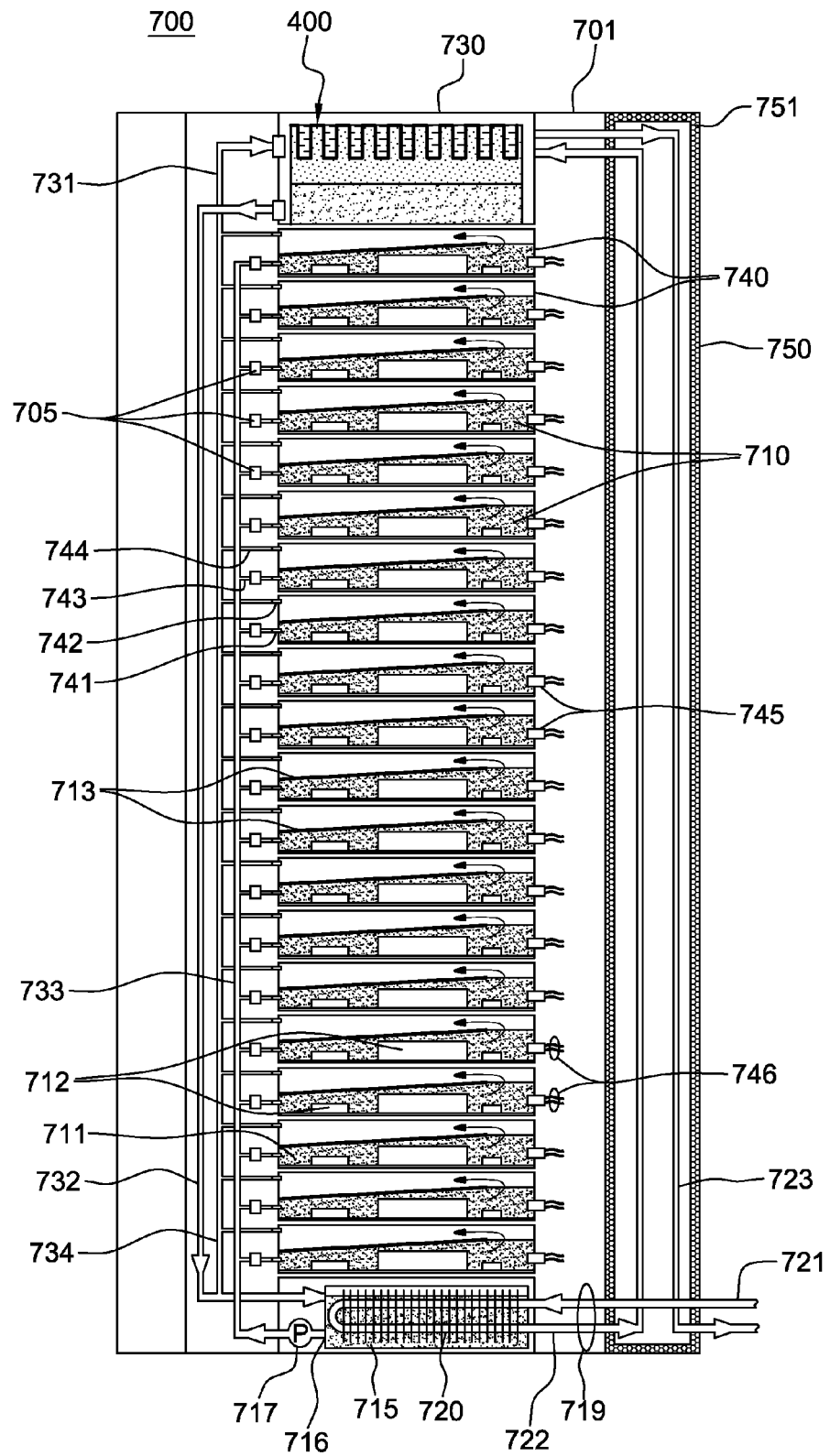
FIG. 7 is an elevational view of another embodiment of a liquid-cooled electronics rack comprising a plurality of immersion-cooled electronic subsystems and vapor condensing, in accordance with an aspect of the present invention.

FIG. 7 is a schematic illustration of an alternate embodiment of a liquid-cooled electronics rack, generally denoted 700, employing immersion-cooling of electronic subsystems 710, in accordance with an aspect of the present invention. In this implementation, the plurality of immersion-cooled electronic subsystems 710 are illustrated horizontally-disposed within an electronics rack 701 so as to be essentially stacked within the rack. By way of example, each electronic subsystem 710 may be a server unit of a rack-mounted plurality of server units, and include multiple electronic components to be cooled. In one embodiment, each electronic subsystem comprises multiple different types of electronic components to be cooled having different heights and/or shapes.

The immersion-cooled electronic subsystems 710 each comprise (in this example) a housing 740 at least partially surrounding and forming a sealed compartment about the electronic subsystem, with the plurality of electronic components 712 of the electronic subsystem being disposed within the sealed compartment. In one example, electronic components 712 include one or more processors and one or more dual in-line memory module (DIMM) arrays. A dielectric fluid 711 is provided within the sealed compartment, and the plurality of electronic components to be cooled are immersed within dielectric fluid 711. A baffle 713 is provided to facilitate maintaining electronic components 712 immersed within the dielectric fluid, and to direct flow of dielectric fluid vapor generated by boiling of dielectric fluid at one or more surfaces of the electronic components towards a dielectric fluid vapor outlet 742 disposed in an upper portion of the sealed compartment. In one embodiment, baffle 713 includes multiple openings which facilitate drainage of any dielectric fluid in liquid state above baffle 713 back to the lower portion of the sealed compartment, and passage of dielectric fluid vapor from the lower portion of the sealed compartment to the upper portion of the sealed compartment. As illustrated, the housing further includes a dielectric fluid inlet 741 through which dielectric fluid in liquid state is provided to the sealed compartment. A dielectric fluid inlet line 743 and a dielectric fluid outlet line 744 couple to the respective dielectric fluid inlet 741 and dielectric fluid vapor outlet 742.

In an operational state, dielectric fluid 711 pools in the liquid state at the bottom of the sealed compartment and is of sufficient volume to submerge the electronic components 712. Electronic components 712 dissipate varying amounts of power, which cause the dielectric fluid to boil, releasing a dielectric fluid vapor, which rises to the upper portion of the sealed compartment of the housing.

One or more hermetically-sealed electrical connectors 745 are also provided in each sealed housing 740, for example, at a back surface thereof, for docking into a corresponding electrical plane of the electronics rack in order to provide electrical and network connections 746 to the electronic subsystem disposed within the sealed housing when the electronic subsystem is operatively positioned within the sealed housing and the sealed housing is operatively positioned within the electronics rack.

As illustrated in FIG. 7, dielectric fluid outlet lines 744 couple in fluid communication dielectric fluid vapor outlets 742 of immersion-cooled electronic subsystems 710 and a dielectric fluid vapor return manifold 731. Dielectric fluid vapor return manifold 731 in turn couples in fluid communication the dielectric fluid vapor outlet lines 744 and a passive vapor-condensing unit 730 disposed in an upper portion of electronics rack 701. As illustrated, passive vapor-condensing unit 730 comprises a vapor-condensing heat exchanger 400 (such as described above in connection with FIGS. 4A-4D), which (in one embodiment) is cooled by facility coolant, and which condenses the egressing dielectric fluid vapor from the respective immersion-cooled electronic subsystems to produce dielectric fluid 711 condensate. This dielectric fluid condensate drops to the bottom of the passive vapor-condensing unit, which includes a condensate drain port in fluid communication with a gravity drain line 732. Gravity drain line 732 directs dielectric fluid condensate via a gravity to a reservoir 715 disposed in a lower portion of electronics rack 701.

Reservoir 715 includes an immersed, sub-cooling heat exchanger 720 for cooling the dielectric fluid before return of the fluid to the immersion-cooled subsystems. As illustrated, a reservoir outlet 716 and a pump 717 are coupled in fluid communication. Pump 717 supplies dielectric fluid under pressure from reservoir 715 to a dielectric fluid supply manifold 733, which couples in fluid communication reservoir 715 and dielectric fluid inlets 741 of the plurality of immersion-cooled electronic subsystems 710, that is, via respective dielectric fluid inlet lines 743. In the illustrated embodiment, a liquid drain pipe 734 is disposed at a lower end of dielectric fluid vapor return manifold 731, coupling the bottom of the return manifold to gravity drain line 732 for draining any dielectric fluid condensate from dielectric fluid vapor return manifold 731. In one embodiment, this liquid drain line 734 is disposed adjacent to an inlet of reservoir 715. Note that, since principally all the heat transfer in the liquid-cooled electronics racks of FIG. 7 occurs via boiling and vapor generation, the total coolant volumetric flow rate to be provided by pump 717 is relatively small.

By way of example only, in one embodiment, the immersed, sub-cooling heat exchanger 720 is a tube and fin heat exchanger, which extracts heat from dielectric fluid within reservoir 715 and dissipates the heat within a facility coolant loop 719, comprising a facility coolant supply line 721 and a facility coolant return line 723. In addition, in the depicted implementation, a facility coolant connect line 722 couples immersed, sub-cooling heat exchanger 720 in series fluid communication with vapor-condensing heat exchanger 400 disposed in the upper portion of the electronics rack. Facility coolant supply and return lines 721, 723 couple the immersed, sub-cooling heat exchanger and vapor-condensing heat exchanger to a data center facility coolant supply and return (not shown). Note that the facility coolant supplied to vapor-condensing heat exchanger 400 needs to be at a temperature below the saturation temperature of the dielectric fluid. By way of example, if the facility coolant is water, a temperature of about 30° C., or higher, may be employed, based on the saturation temperature of the dielectric fluid within the liquid-cooled electronics rack. Such a relatively high coolant temperature means that minimum cooling power is required to produce the facility coolant at the desired temperature to remove heat from the electronics rack.

Note also, in this embodiment, electronics rack 701 comprises a door 750, which is sized to accommodate vertical portions of the facility coolant connect line 722 and facility coolant return line 723. Insulation 751 is provided in door 750 to inhibit condensation on the portion of the facility coolant lines within the door in cases where facility coolant is below the room air dew point.

In general, fluidic coupling between the electronic subsystems and the dielectric fluid manifolds and lines, as well as between the manifolds and the vapor-condensing heat exchanger, and reservoir, and the facility coolant supply and return, can be established using suitable hoses, hose barb fittings and quick disconnect couplers. In one example, the illustrated, vertically-oriented dielectric fluid vapor return and dielectric fluid supply manifolds each include ports which facilitate fluid connection of the respective components to the manifolds via flexible hoses. Respective quick connect couplings may be employed to couple flexible dielectric fluid inlet and outlet lines 743, 744 to the respective dielectric fluid inlets and vapor outlets of the immersion-cooled electronic subsystems, to (for example) allow for removal of a housing and electronic subsystem from the electronics rack.

As an enhancement, multiple flow restrictors 705 may be disposed, in this example, at the dielectric fluid inlets to the immersion-cooled electronic subsystems 710. These flow restrictors may be configured and positioned to eliminate any maldistribution of dielectric fluid flow through the multiple immersion-cooled electronic subsystems. The flow restrictors provided in the embodiment of FIG. 7 facilitate tailoring dielectric fluid flow resistance through the immersion-cooled electronic subsystems. These flow restrictors may comprise fixed or adjustable flow restrictors, or both.

Fixed flow restrictors comprise a fixed orifice diameter, and two or more of the fixed orifice diameters of the flow restrictors in the liquid-cooled electronics rack may be differently sized to define different coolant flow resistances through at least two different immersion-cooled electronic subsystems, for example, depending on the electronic subsystems to be cooled and/or the location of the electronic subsystems within the rack relative to, for example, pump 717. By defining different dielectric fluid flow resistances, the multiple flow restrictors tailor the dielectric fluid flow to facilitate overall heat transfer within the plurality of immersion-cooled electronic subsystems by, for example, facilitating maintaining a desired liquid level within each of the electronic subsystems.

In an alternative embodiment, the multiple flow restrictors each may be fixed flow restrictors with fixed orifice diameters of equal size. This would ensure a common dielectric fluid flow into the plurality of immersion-cooled electronic subsystems. This implementation might be advantageous where it is assumed that electronic subsystems within the electronics rack are identical, whereas different flow restrictors with different fixed orifice diameters may be beneficial in an implementation where the electronic subsystems are differently sized and/or powered.

Those skilled in the art should note from the above description, that although depicted with reference to the embodiment of FIG. 7, the multiple flow restrictors could also, alternatively, be applied in combination with the liquid-cooled electronics rack embodiment of FIGS. 6A & 6B as well. In addition, although principally described above as fixed flow restrictors, one or more of the multiple flow restrictors could comprise adjustable flow restrictors controlled, for example, with reference to a level of dielectric fluid within the respective immersion-cooled electronic subsystem. Such a configuration would provide an advantage in that each electronic subsystem would be self-monitoring and adjust the dielectric fluid flow resistance therethrough as required to cool the heat load generated by the electronic subsystem. By way of example, various passively controlled, adjustable flow restrictors are provided by Metrix Valve Corp., of Glendora, Calif., U.S.A.

Advantageously, the vapor condenser depicted in FIGS. 4A-4D may be employed in a variety of cooling apparatus implementations including, by way of example, the cooling implementations described above in connection with FIGS. 5A-7. Although the dimensions might change depending upon the implementation, in each instance, the vapor condenser is provided with a three-dimensional folded structure comprising a thermally conductive sheet with multiple folds in the sheet to facilatie defining a first set of coolant-carrying channels and a second set of vapor condensing channels, which are separated only by the thickness of the thermally conductive sheet material. By considering different material characteristics and thicknesses, a desired heat transfer between the vapor condensing surface and the coolant cooled surface of the sheet material may be obtained. In this manner, a highly efficient vapor condenser is achieved in combination with first and second end manifolds and a top plate, as described above. As noted, the multiple folds in the thermally conductive sheet may comprise a repeating pattern which may (if desired) define the coolant-carrying channels with a common transverse cross-sectional area as the vapor condensing channels. In one implementation, the vapor condensing channels are provided with a high aspect ratio of height to width to, in part, increase the vapor condensing surface area, as well as to accommodate for the presence of uncondensable gasses within the sealed compartment within which the vapor condenser may be employed.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A cooling apparatus comprising:
   a vapor condenser comprising a three-dimensional folded structure. defining, at least in part, a first set of coolant-carrying channels and a second set of vapor condensing channels of the vapor condenser, the first set of coolant-carrying channels being interleaved with and extending parallel to the second set of vapor condensing channels; and
   wherein the three-dimensional folded structure comprises a thermally conductive sheet with multiple folds therein, wherein one side of the thermally conductive sheet comprises a vapor condensing surface, and an opposite side of the thermally conductive sheet comprises a coolant-cooled surface, at least a portion of the coolant-cooled surface at least partially defining the first set of coolant-carrying channels.

2. The cooling apparatus of claim 1, wherein the multiples folds in the thermally conductive sheet of the three-dimensional folded structure comprise a repeating pattern of folds in the thermally conductive sheet.

3. The cooling apparatus of claim 2, wherein the repeating pattern of folds defines at least one coolant-carrying channel of the first set of coolant-carrying channels with a common transverse cross-sectional area as at least one vapor condensing channel of the second set of vapor condensing channels.

4. The cooling apparatus of claim 1, wherein the three-dimensional folded structure further comprises a top plate and a first end manifold and a second end manifold, the top plate and the first and second end manifolds facilitating defining the first set of coolant-carrying channels in combination with the thermally conductive sheet with the multiple folds, wherein the first end manifold and the second end manifold are disposed at opposite ends of the three-dimensional folded structure and comprise openings aligned with the first set of coolant-carrying channels to facilitate the flow of coolant therethrough.

5. The cooling apparatus of claim 1, wherein the second set of vapor condensing channels of the three-dimensional folded structure are open channels which allow fluid vapor to rise into the second set of vapor condensing channels and condensed fluid to drop from the second set of vapor condensing channels.

6. The cooling apparatus of claim 1, wherein at least one vapor condensing channel of the second set of vapor condensing channels comprises an elongate channel comprising a transverse cross-section with a high aspect ratio of height to width, wherein the height of the elongate channel is at last two times the width thereof.

7. The cooling apparatus of claim 1, wherein coolant within the first set of coolant-carrying channels at last partially contacts the coolant-cooled surface of the thermally conductive sheet of the three-dimensional folded structure.

8. A cooling apparatus comprising:
   a housing configured to facilitate forming a compartment;
   a fluid disposed within the compartment; and
   a vapor condenser, the vapor condenser comprising a three-dimensional folded structure defining, at least in part, a first set of coolant-carrying channels and a second set of vapor condensing channels, the first set of coolant-carrying channels being interleaved with and extending parallel to the second set of vapor condensing channels, wherein the three-dimensional folded structure comprises a thermally conductive sheet with multiple folds therein, wherein one side of the thermally conductive sheet comprises a vapor condensing surface, the vapor condensing surface being exposed within the compartment in an upper portion of the compartment, and the second set of vapor condensing channels increasing a condensation surface area of the vapor condensing surface, and thereby facilitating cooling of fluid vapor rising to the upper portion of the compartment.

9. The cooling apparatus of claim 8, wherein an opposite side of the thermally conductive sheet of the three-dimensional folded structure comprises a coolant-cooled surface, with at least a portion of the coolant-cooled surface at least partially defining the first set of coolant-carrying channels, and wherein coolant within the first set of coolant-carrying channels contacts the coolant-cooled surface of the thermally conductive sheet of the three-dimensional folded structure.

10. The cooling apparatus of claim 8, wherein the multiples folds in the thermally conductive sheet of the three-dimensional folded structure comprise a repeating pattern of folds in the thermally conductive sheet.

11. The cooling apparatus of claim 10, wherein the repeating pattern of folds defines at. least one coolant-carrying channel of the first set of coolant-carrying channels with common transverse cross-sectional area as at least one vapor condensing channel of the second set of vapor condensing channels.

12. The cooling apparatus of claim 8, wherein the three-dimensional folded structure further comprises a top plate and a first end manifold and a second end manifold, the top plate and the first and second end manifolds facilitating defining the first set of coolant-carrying channels in combination with the thermally conductive sheet with the multiple folds, wherein the first end manifold and the second end manifold are disposed at opposite ends of the three-dimensional folded structure and comprise openings aligned with the first set of coolant-carrying channels to facilitate the flow of coolant therethrough.

13. The cooling apparatus of claim 8, wherein the second set of vapor condensing channels of the three-dimensional folded structure are open channels which allow fluid vapor to rise into the second set of vapor condensing channels and condensed fluid to drop from the second set of vapor condensing channels.

14. The cooling apparatus of claim 8, wherein at least one vapor condensing channel of the second set of vapor condensing channels comprises an elongate channel comprising a transverse cross-section with a high aspect ratio of height to width, the height of the elongate channel being at least two times the width thereof.

15. The cooling apparatus of claim 8, wherein the housing is configured to at least partially surround and form the compartment about at least one electronic component to be cooled, and wherein the at least one electronic component to be cooled is at least partially immersed within the fluid within the compartment.

16. A liquid-cooled electronics rack comprising:
    a plurality of immersion-cooled electronic subsystems, at least one immersion-cooled electronic subsystem of the plurality of immersion-cooled electronic subsystems comprising:
        a housing at least partially surrounding and forming a compartment about an electronic subsystem, the electronic subsystem comprising at least one electronic component to be cooled;
        a dielectric fluid disposed within the compartment, wherein the at least one electronic component to be cooled is at least partially immersed within the dielectric fluid; and
        a dielectric fluid inlet and a dielectric fluid vapor outlet in fluid communication with the compartment, wherein dielectric fluid is provided to the compartment via the dielectric fluid inlet, and dielectric fluid vapor egresses from the compartment via the fluid dielectric vapor outlet; and
    a vapor condenser heat exchanger to facilitate condensing of dielectric fluid vapor egressing from the compartment(s) of the at least one immersion-cooled electronic subsystem, the vapor condenser heat exchanger comprising a three-dimensional folded structure defining, at least in part, a first set of coolant-carrying channels and a second set of vapor condensing channels, the first set of coolant-carrying channels being interleaved with and extending parallel to the second set of vapor condensing channels, wherein the three-dimensional folded structure comprises a thermally conductive sheet with multiple folds therein, wherein one side of the thermally conductive sheet comprises a vapor condensing surface, and an opposite side of the thermally conductive sheet comprises a coolant-cooled surface, at least a portion of the coolant-cooled surface at least partially defining the first set of coolant-carrying channels, and wherein coolant within the first set of coolant-carrying channels at least partially contacts the coolant-cooled surface of the thermally conductive sheet of the three-dimensional folded structure.

17. The liquid-cooled electronics rack of claim 16, wherein the multiple folds in the thermally conductive sheet of the three-dimensional folded structure of the vapor condenser heat exchanger comprise a repeating pattern of folds in the thermally conductive sheet.

18. The liquid-cooled electronics rack of claim 17, wherein the repeating pattern of folds defines at least one coolant-carrying channel of the first set of coolant-carrying channels with a common transverse cross-sectional area as at least one vapor condensing channel of the second set of vapor condensing channels.

19. The liquid-cooled electronics rack of claim 16, wherein the three-dimensional folded structure of the vapor condenser heat exchanger further comprises a top plate and a first end manifold and a second end manifold, the top plate and the first and second end manifolds facilitating defining the first set of coolant-carrying channels in combination with the thermally conductive sheet with the multiple folds, wherein the first end manifold and the second end manifold are disposed at opposite ends of the three-dimensional folded structure and comprise openings aligned with the first set of coolant-carrying channels to facilitate the flow of coolant therethrough.

20. The liquid-cooled electronics rack of claim 16, wherein the second set of vapor condensing channels of the three-dimensional folded structure of the vapor condenser heat exchanger are open channels which allow dielectric fluid vapor to rise into the second set of vapor condensing channels and dielectric fluid to drop from the second set of vapor condensing channels.

* * * * *